(12) United States Patent
Wald

(10) Patent No.: US 6,181,134 B1
(45) Date of Patent: Jan. 30, 2001

(54) MAGNETIC RESONANCE IMAGING OF THE DISTRIBUTION OF A MARKER COMPOUND WITHOUT OBTAINING SPECTRAL INFORMATION

(75) Inventor: Lawrence L. Wald, Cambridge, MA (US)

(73) Assignee: The McLean Hospital Corporation, Belmont, MA (US)

( * ) Notice: Under 35 U.S.C. 154(b), the term of this patent shall be extended for 0 days.

(21) Appl. No.: 09/036,991

(22) Filed: Mar. 9, 1998

(51) Int. Cl.[7] .............................. G01R 33/20; G01V 3/00
(52) U.S. Cl. ........................................... 324/307; 324/309
(58) Field of Search ..................................... 324/309, 307, 324/306, 300, 318; 600/410, 420, 424, 422, 423

(56) References Cited

U.S. PATENT DOCUMENTS 4,733,185   3/1988   Bottomley ............................ 324/309

OTHER PUBLICATIONS

Adalsteinsson et al., Three–dimensional spectroscopic imaging with time–varying gradients. *Magn. Reson. Med.* 33:461–466 (1995).

Deicken et al., Decreased left frontal lobe N–acetylaspartate in schizophrenia. *American Journal of Psychiatry* 154(5):688–90 (1997).

Duyn et al., Multisection proton MR spectroscopic imaging of the brain. *Radiology* 188:277–282 (1993).

Ebisu, et al., N–Acetylaspartate as an in vivo marker of neuronal viability on kainate induced status epilepticus: 1H magnetic resonance spectroscopic imaging. *J. Cereb. Blood Flow Metab.* 14:373–382 (1994).

Edelstein et al., The intrinsic signal to noise ratio in NMR imaging. *Magn. Reson. Med.* 3(4):604–618 (1986).

Garcia et al., Correlation of seizure frequency with N–acetyl-l–aspartate levels determined by 1H magnetic resonance spectroscopic imaging. *Magnetic Resonance Imaging* 15(4):475–8 (1997).

Guimaraes et al., Quantitative in vivo 1H nuclear magnetic resonance spectroscopic imaging of neuronal loss in rat brain. *Neuroscience* 69(4):1095–1101 (1995).

Guimaraes et al., 4D echo planar imaging of brain metabolites in "2$^{nd}$ Annual Meeting of the Society for Magnetic Resonance", San Francicso, CA: 177 (1994).

Haas et al., 1H NMR chemical shift selective (CHESS) imaging. *Phys. Med. Biol.* 30:341–344 (1985).

Higuchi et al., Effects of severe global ischemia on N–acetylaspartate and other metabolites in the rat brain. *Magn. Reson.. in Med.* 37(6): 851–7 (1997).

Hore, PJ, Solvent Suppression in Fourier Transform Nuclear Magnetic Resonance. *J. Magn. Reson.* 283–300 (1983).

Hu et al., Direct in vivo 1H metabolite imaging: 0.3cc NAA image of human brain in less than 7 minutes at 1.5T. in Proceedings of International Society for Magnetic Resonance in Medicine, 4$^{th}$ Scientific Meeting, New York:1223 (1996).

(List continued on next page.)

Primary Examiner—Christine K. Oda
Assistant Examiner—Tiffany A. Fetzner
(74) Attorney, Agent, or Firm—Clark & Elbing, LLP

(57) ABSTRACT

The invention provides a method for imaging the distribution of n-acetylaspartic acid (NAA) in mammalian neuronal tissue, by a) exciting the neuronal tissue to generate magnetic resonance signals, including signals corresponding to NAA; b) suppressing non-NAA magnetic resonance signals by a combination of band selective inversion with gradient dephasing, and chemical shift selective pre-excitation; c) encoding a first spatial dimension of the NAA signal with readout encoding and a second spatial dimension of the NAA signal with gradient phase encoding, and d) using the encoded first and second spatial dimensions to image, by reconstrucion, the distribution of NAA in the tissue.

14 Claims, 14 Drawing Sheets

OTHER PUBLICATIONS

Lim et al., Estimating NAA in cortical gray matter with applications for measuring changes due to aging. *Magn. Reson. Med.* 37(3):372–377 (1997).

MacKay, et al., Alzheimer disease and subcortical ischemic vascular dementia: evaluation by combining MR imaging segmentation and H–1 MR spectroscopic imaging. *Radiology* 198(2):537–45 (1996).

Mansfield et al., Spatial mapping of the chemical shift in NMR. *Magn. Reson. Med.* 1:370–386 (1984).

Mescher et al., Solvent suppression using selective echo dephasing. *J. Magn. Reson. A* 123:226–229 (1996).

Posse et al., Three–dimensional echo–planar MR spectroscopic imaging at short echotimes in the human brain. *Radiology* 192:733–738 (1994).

Schick et al., Highly selective water and fat imaging applying multislice sequences without sensitivity to B1 field inhomogeneities. *Magn. Reson. Med.* 38:269–274 (1997).

Spielman et al., Lipid–suppressed single– and multisection proton spectroscopic imaging of the human brain. *J. Magn. Reson. Imaging* 2:253–263 (1992).

Star–Lack et al., Improved water and lipid suppression for 3D PRESS CSI using RF band selective inversion with gradient dephasing (BASING). *Magn. Reson. Med.* 38:311–321 (1997).

Tsai et al., N–Acetylaspartate in Neuropsychiatric Disorders. *Progress in Neurobiology* 46:531–540 (1995).

Wald et al., Serial proton magnetic resonance spectroscopic imaging of glioblastoma multiforme after brachytherapy. *J Neurosurg* 87:525–534 (1997).-

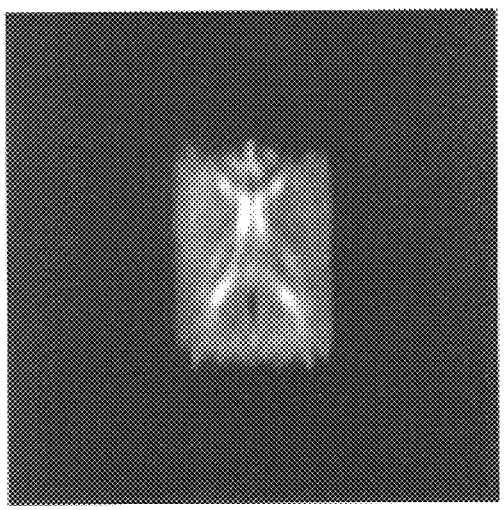 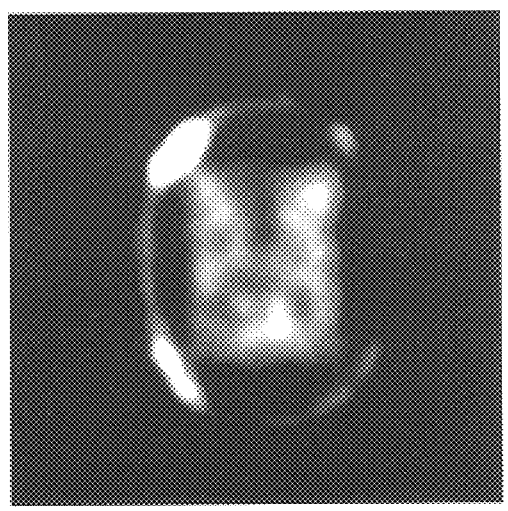
Fig. 4A                              Fig. 4B

MAGNETIC RESONANCE IMAGING OF THE DISTRIBUTION OF A MARKER COMPOUND WITHOUT OBTAINING SPECTRAL INFORMATION

BACKGROUND OF THE INVENTION

Neurodegenerative disorders include Alzheimer's disease, amyotrophic lateral sclerosis (ALS), Parkinson's disease, and multiple sclerosis. Selective neuronal loss or necrosis is also associated with disorders such as schizophrenia, ischemia, cancer, and stroke. Reduced levels of NAA are also associated with mesial temporal lobe epilepsy.

A dicarboxylic acid found almost exclusively in neurons, N-acetylaspartic acid (NAA) is endogenously localized in the cytoplasm. Formed in the presence of acetyl CoA and a membrane-bound enzyme from brain or spinal cord, NAA is the amino acid or amino acid derivative found in highest concentration in the brain, except for glutamic acid. NAA appears to be metabolically inert in adults and may function as an anion or to effect behavioral changes. The level of NAA correlates with neuronal health. Mapping levels and distribution of NAA in a brain is a noninvasive measure of neuronal density, which is useful in the study, staging, and diagnosis of disorders relating to neuronal injury, loss, or degeneration.

Conventional magnetic resonance spectroscopic imaging (MRSI), or chemical shift imaging (CSI), has been used to map NAA. See, for example, Brown et al., *Proc. Natl. Acad. Sci. (USA)* 79:3523–3526 (1982), and Maudsley et al., *J. Magn. Reson.* 51:147–152 (1983). Spatial and spectral information can be acquired simultaneously by using a time-varying, periodic magnetic field gradient wave form during the data acquisition (Echo Planar-CSI or EPCSI). Mansfield, *Magn. Reson. Med.* 1:370–386 (1984). Other approaches include acquiring data from different slices in the brain, and using multiple echoes. Duyn et al., *Radiology* 188:277–282 (1993) and Spielman et al., *J. Magn. Reson. Imaging* 2:253–262, (1992).

These methods provide an NAA map of 16×16 or 32×32 pixels, the latter requiring about 17 minutes by conventional CSI/MRSI techniques. A 256×64 image would take a minimum of 4.5 hours. EP-CSI can acquire a 32×32×16 matrix in a 17 minute scan with degraded spectral resolution. EP-CSI requires post-processing algorithms even more complicated than conventional CSI/MRSI. The acquired data is manipulated and reconstructed with the aid of custom software and a skilled operator.

SUMMARY OF THE INVENTION

The invention features a method for imaging the distribution of a marker compound in a sample, such as living tissue, using magnetic resonance imagining. The method includes i) exciting the tissue to generate magnetic resonance signals, including signals corresponding to the marker compound and ii) suppressing non-marker compound magnetic resonance signals using band selective inversion with gradient dephasing and chemical shift selective pre-excitation. The method can further include iii) encoding the remaining marker compound signal using conventional readout and phase encoding gradients. Examples of marker compounds include n-acetyl aspartic acid, citrate, choline, phosphocreatine, and lactate in mammalian tissue.

One aspect of the invention is a method for imaging the distribution of n-acetylaspartic acid (NAA) in mammalian neuronal tissue. This method includes the steps of (a) exciting the neuronal tissue to generate magnetic resonance signals, including signals corresponding to NAA; and (b) suppressing non-NAA magnetic resonance signals by a combination of band selective inversion with gradient dephasing, and chemical shift selective pre-excitation and dephasing. The suppressing step (b) can suppress magnetic resonances down field from 2.5 ppm. The chemical shift selective pre-excitation can includes an excitation bandwidth of about 1.8 ppm to 2.5 ppm, where the bandwidth includes the water resonance. The band selective inversion can include an excitation bandwidth of about 1.8 ppm to 2.5 ppm. The dephasing can produce a suppression band which includes the water resonance at about 4.7 ppm, the choline resonance at about 3.2 ppm, and the phosphocreatine resonance at about 3.0 ppm.

Embodiments of the invention can further include after the suppressing step (b), the step (c) of encoding the NAA signal with conventional readout and phase encode gradients. This step is an encoding step, in other words, a data acquisition step. One aspect of the invention further includes, after the encoding step (c), the step (d) of reconstructing the image using two-dimensional Fourier transformation to obtain a NAA weighted image. The encoding step (c) has, for example a minimum imaging time of 96 seconds for a spatial encoding matrix of at least 256×64; or a minimum imaging time of between 30 and 260 seconds for a spatial encoding matrix of 256×256. The exciting step (a) can include slice selective spin-echo excitation. An example of slice selective spin-echo excitation includes volume selective double spin-echo excitation (which in turn can include orthogonal slice selection pulses in a double spin echo configuration (90°-180°-180° or, alternatively, a STEAM localization configuration (90°-90°-90°).

The above methods can be used, for example, to measure citrate in prostate tissue; lactate, choline, or phosphocreatine in any tissue; or n-acetyl aspartic acid, choline, or phosphocreatine in neuronal tissue.

Other features and advantages of the invention will be apparent from the disclosure, figures, and claims below.

BRIEF DESCRIPTION OF THE DRAWINGS

FIG. 2a is a water image showing PRESS localized region and inner cylinder containing water and 12.5 mM of NAA and outer region with water only. FIG. 2b is a 256×128 NAA weighted image, 0.78 mL nominal voxel volume and total acquisition time of 13 minutes, showing a signal only from the NAA-containing region. FIG. 2c is an NAA weighted image low pass filtered to 1 cm resolution.

FIG. 3a is a composite image of a PRESS excitation region with a 16×16 CSI grid overlaid on a convention water image. FIG. 3b is a subset of spectra from a 16×16 CSI acquisition, 3.1 mL nominal voxel volume. FIG. 3c is an enlarged spectrum from the NAA containing region of the phantom. FIG. 3d is an NAA map formed from the CSI acquisition of FIG. 3b. FIG. 3e is an NAA map zero-filled.

FIGS. 4a and 4b are images obtained from a normal subject. FIG. 4a is a water image acquired with the NAA mapping sequence of FIG. 1 with no water suppression. FIG. 4b is an NAA weighted image low pass filtered to 1 cm resolution, 256×128 matrix, 0.78 mL voxel volume prior to filtering, 13 minute acquisition time.

FIG. 5a is a PRESS localized spectrum with CHESS and MEGA-BASING suppression centered on the water region. FIG. 5b is a spectrum with MEGA-BASING suppression placed to suppress choline (Cho) and phosphocreatine (Cre) resonances. FIG. 5c is a conventional water image overlaid with a 16×16 CSI grid and PRESS excitation region. FIG. 5d is a subset of spectra from the brain region of a 16×16 CSI acquisition, 3.1 mL nominal voxel volume, 13 minute total acquisition time. FIG. 5e is an NAA map formed from the CSI data. FIG. 5f is the corresponding NAA map zero filled.

FIG. 6a is the conventional image. FIG. 6b is an NAA weighted image, 256×128 matrix, 0.78 mL voxel volume, 13 minute acquisition time. FIG. 6c is an NAA weighted image low pass filtered to 1 cm resolution.

FIG. 7a is a conventional water image overlaid with a CSI grid and PRESS excitation region. FIG. 7b is a subset of spectra from brain region of 16×16 CSI acquisition, 3.1 mL nominal voxel volume, 13 minute total acquisition time. FIG. 7c is a PRESS localized spectrum. FIG. 7d is an NAA map formed from the CSI data. FIG. 7e is an NAA map zero filled.

FIG. 11a is a block representation of a NAA weighted imaging sequence having a length of 0.312 seconds. FIG. 11b is a scheme of blocks repeated every TR seconds, in this case, TR=2.0 seconds, with a different phase encode amplitude. Each phase encode step can be similarly repeated to signal average for increased sensitivity. FIG. 11c is a completed scheme for multi-slice NAA mapping showing blocks applied to additional slice locations during the otherwise unused time within the TR period. The series is repeated every TR seconds using a different phase encode amplitude, or is repeated to signal average for increased sensitivity.

DESCRIPTION OF THE PREFERRED EMBODIMENTS

A. Definitions

Figure 1:
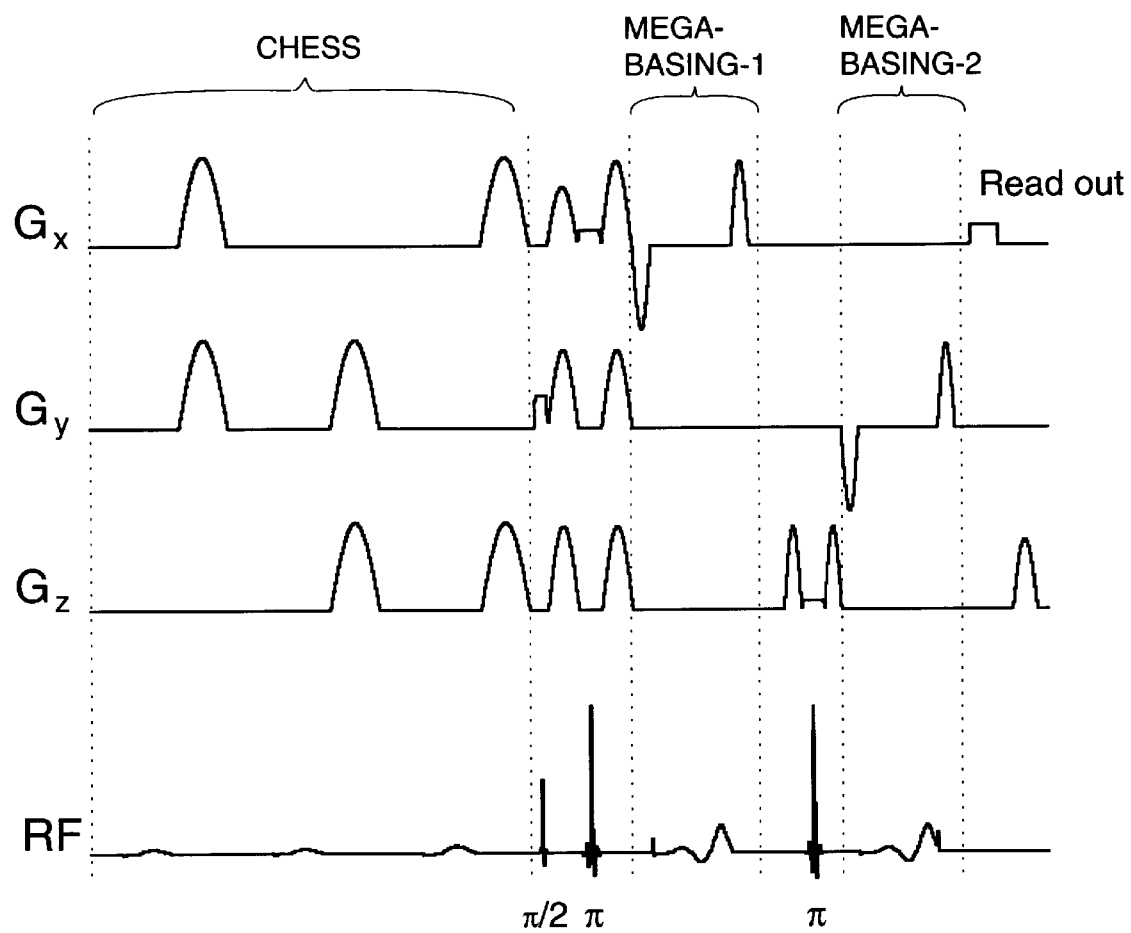
FIG. 1 is a schematic pulse sequence for NAA weighted imaging. The sequence consists of an asymmetric PRESS excitation with CHESS and MEGA-BASING water suppression. Spatial encoding is achieved with the x axis readout gradient and a y phase encode gradient added to the crusher after the slice selective π/2 pulse.

Some terms are defined below and by their use herein.

Band Selective Inversion with Gradient Dephasing is a method for suppressing unwanted spectral resonances (such as water) by acting on these resonances with a chemical shift selective (frequency selective) inversion pulse after the initial excitation pulse of a sequence and subsequent dephasing of the effective resonances with anti-symmetric gradient pulses. (Meicher et al. 1996, Star-Lack et al. 1997). The process of acting on the undesired resonances with inversion pulses (also known as refocusing pulses) while the magnetization is in the transverse plane is advantageous, in part, because longitudinal relaxation (T1) during and after the suppression process does not adversely affect the degree of suppression.

Chemical Shift Selective Pre-Excitation is a method for suppressing unwanted spectral resonances (such as water) by acting on these resonances with one or more chemical shift selective (frequency selective) excitation pulses before the initial excitation pulse. (Haas et al. 1985). The transverse magnetization created by each pre-excitation pulse is dephased by gradient pulses immediately following the pre-excitation pulses. Typically, two chemical shift selective 90° RF pulses are used together with a third chemical shift selective RF pulse of adjustable flip angle. The flip angle of the last pulse is adjusted to partially compensate for the T1 relaxation that occurs in the time interval between the pre-excitation pulses and the excitation pulse.

Conventional Readout Gradient Encoding is a method for encoding the MR signal to provide the spatial information necessary for producing an image of the detected MR signal. Readout gradient encoding is commonly used to encode one of the two spatial dimensions in a 2 dimensional MR image. In the readout technique, the MR signal is digitized while an magnetic field gradient is applied to the object. This method is also referred to as frequency encoding since the frequency of the resulting signal is a function of the position from which the signal originated.

Excitation Bandwidth is the range of frequencies excited by a radio frequency pulse.

Gradient Phase Encoding is a method for encoding the MR signal to provide the spatial information necessary for producing an image of the detected MR signal. Gradient phase encoding is commonly used to encode one of the two spatial dimensions in a 2 dimensional MR image. In the phase encoding technique, a gradient pulse is applied after the initial excitation of the MR signal. The phase encode gradient causes the transverse magnetization to develop a phase shift which is proportional to the position from which the signal originated. Gradient phase encoding is commonly used to encode the one spatial dimension of a 2 dimensional MR image. Readout encoding is commonly used to encode the other. In chemical shift imaging (CSI, also known as MR spectroscopic imaging), phase encoding is used to encode the spatial information in all of the spatial dimensions.

Marker compound is a compound or composition that has a magnetic resonance signal. The signal may be narrow and sharp, such as that of NAA, or it may be broader with multiple peaks, such as that of glutamate. Markers include NAA, glutamate, citrate, choline, and lactate. In some cases, the disclosed method can be used even when a marker signal overlaps with another signal. For example, the signals for choline and phosphocreatine are quite close. However, the level of phosphocreatine, a marker for energy metabolism, is generally stable whereas the level of choline, a marker for cancer, can vary up to 5 times or 10 times normal. Elevated choline is associated with the turnover of phospholipid membranes resulting from rapid cell division, and thus is associated with almost all types of cancer, including breast cancer, lymphomas, and primary and metastatic brain tumors. Thus, even the combined area under the choline/phosphocreatine signal provides information correlated with the status of the patient. Glutamate is a marker for metabolic disorders and excitotoxicity disorders. Excessive glutamate release may result from a neuronal lack of energy to contain glutamate (as in stroke), or the excessive firing of glutamatergic neurons during a seizure (as in epilepsy), or other mechanisms such as ALS. Citrate is a marker found in the prostate and therefore useful for monitoring prostate conditions, including prostate cancer. Lactate is a marker for anaerobic energy metabolism and therefore useful for monitoring the effects of ischemia or stroke.

Minimum imaging time is the minimum time required to form an image with a given technique. The total imaging time can be a multiple of the minimum imaging time since the spatial encoding steps can be repeated and averaged to improve the signal to noise ratio of the resulting image. A short minimum imaging time provides increased flexibility in this trade-off between total imaging time and signal to noise ratio.

Suppression Bandwidth is the range of frequencies in the spectrum that is effectively suppressed by a suppression technique such as chemical shift selective pre-excitation or band selective inversion with gradient dephasing. The suppression bandwidth is typically determined by the frequency bandwidth of the radiofrequency pulse used in the suppression technique. Other characteristics of the graph of degree of suppression as a function of spectral frequency, such as the center frequency of the suppression bandwidth and the transition bandwidth (width of the transition between full suppression and negligible suppression), are also determined by the characteristics of the radio frequency pulse.

Water Resonance is the magnetic resonance spectral line that arises from the protons in the water molecule. The position of this resonance in the in vivo proton spectrum is at approximately 4.7 ppm and typically has a linewidth ranging from 0.05 ppm to 0.15 ppm.

B. NAA Imaging

According to the invention, in one embodiment, the NAA resonance is isolated by suppressing the resonances of all other compounds in the brain during data acquisition. According to the invention, it is unnecessary to obtain spectral information. A standard image can be formed using the standard read out gradient and phase encoding gradient method. This is an NAA weighted image. At least two frequency selective suppression techniques are used to isolate the NAA resonances. For example, the pulse sequence can include CHESS followed by BASING. Although CHESS is dependent upon relaxation parameters, BASING is not. These suppression methods are CHESS (Haase et al., *Phys. Med. Biol.* 30:341–344, (1985)) and BASING (Star-Lack et al., *Magn. Reson. Med.* 38:311–321, (1997)). These and other references cited herein are provided for the reader's convenience and are hereby incorporated by reference in their entirety.

The following method is an example of the invention. All of the experiments were performed on a 1.5 Tesla clinical MR scanner (General Electric Medical Systems, Milwaukee, Wis.) with 1.0 g/cm maximum gradient strength. Radio-frequency excitation and detection were performed with a clinical quadrature birdcage head coil. The linear shim currents were optimized over the desired axial slice with the field mapping sequence provided by General Electric. An additional 15 dB of gain was added after the pre-amplifier to increase the dynamic range of the NAA images.

The NAA mapping sequence, shown in FIG. 1, consists of CHESS excitation and dephasing pulses followed by an asymmetric PRESS sequence with the frequency selective MEGA-BASING $\pi$ pulses and anti-symmetric crusher gradients following each of the slice selective pulses. The MEGA-BASING $\pi$ pulses selectively crushed resonances (such as water) within their excitation band. Resonances outside of the MEGA-BASING excitation band were not dephased since the net crusher gradient area was zero. All of the radiofrequency pulses were designed using the Shinnar-LeRoux algorithm. Other appropriate methods or types of pulses include sinc and windowed sinc pulses, DANTE pulses, and preferably adiabatic inversion pulses. The CHESS and MEGA-BASING excitation pulses were minimum phase pulses with an excitation bandwidth of 125–160 Hz and 130 Hz respectively. The excitation band of the CHESS pulses was centered on the water resonance. The excitation band of the MEGA-BASING pulses was set further up field (~40 Hz up field from water) to suppress choline and creatine signals. The PRESS selected region was chosen to fall entirely within the brain in order to reduce contamination from subcutaneous lipids. In the human data, a single out-of-voxel lipid suppression band was placed on the right side of the head just outside of the PRESS region to further reduce lipid signals.

The NAA images were acquired from an axial slice through the brain or phantom with an imaging matrix of 256×64, field of view (FOV) of 80 cm and 8 excitations (number of excitations, "NEX") or a matrix of 256×128 with a FOV of 160 cm in the readout direction and 80 cm in the phase encode direction and 4 NEX. A 2 cm slice thickness, with a nominal voxel volume of 0.78 ml, was used. The sequence used a TE of 144 ms, and a TR of 1.5 s giving a total imaging time of 13 minutes. A readout bandwidth of 32 kHz was used yielding a data acquisition window length of 8 ms for the 256 point acquisition.

Measurements were obtained from a phantom consisting of two concentric cylinders with 8 cm and 23 cm diameters. The inner cylinder contained a solution of NAA at approximately physiological concentration (12.5 mM) and the outer cylinder contained water. Both compartments were doped with 1 mL of gadodiamide solution (Sanofi Winthrop Pharmaceuticals, New York, N.Y.) per liter. The PRESS box was prescribed to completely excite a cross section of the inner (NAA-containing) cylinder as well as a significant volume of the water-only region.

The suppression of the undesired resonances was optimized by monitoring the proton spectrum from the PRESS selected region without the readout gradient using a spectral bandwidth of 2 kHz and digitizing 1024 points in the time domain (512 ms acquisition window). The flip angle of the last CHESS pulse was adjusted interactively to minimize the amplitude of the water resonance with CHESS alone. Then the MEGA-BASING pulses were applied and offset to suppress the 3.2 ppm choline and 3.0 ppm creatine resonances. The peak height of the NAA resonance was measured before and after application of the MEGA-BASING pulses to insure that the creatine and choline resonances were suppressed without significant alteration of the NAA amplitude.

An averaged spectrum from the PRESS localized region was obtained to assess the relative global contribution of the water, NAA, creatine, choline, glutamate plus glutamine, and lipid resonances to the PRESS localized spectrum. The relative contributions of these resonances to the NAA weighted image was determined by integrating the spectral regions of the PRESS localized spectrum. First, the NAA methyl resonance was measured by fitting the 2.0 ppm spectral peak to a Lorentzian function. This function was subtracted from the spectrum and the residual spectrum was integrated to determine the signal intensity in the water region (5.5 ppm to 4.0 ppm) and metabolite region (4.0 ppm to 2.0 ppm). The metabolite region of the residual spectrum is expected to contain contributions from creatine, choline, glutamate, glutamine, and the aspartate resonances of NAA. The NAA phantom spectra acquired with the MEGA-BASING sequence showed that the NAA aspartate resonances at 2.5 ppm and 2.7 ppm contributed about 12% of the total NAA signal.

To assess the relative contribution of water, creatine, choline, NAA, and lipid to the NAA map, conventional CSI data were acquired by removing the readout gradient. The spectroscopic imaging data were acquired using PRESS and suppression parameters that were identical to the NAA mapping sequence and 16×16 phase encoding, FOV=20 cm or 16 cm, 2 kHz spectral bandwidth, 1024 spectral points, 2 acquisitions per phase encode step, and a TR of 1.5 or 2.0 s, yielding a total acquisition time of 13 or 17 minutes, respectively. The spectroscopic image was formed using exponential apodization in the time domain (2 Hz Lorentzian width) and no apodization in kspace. The effective suppression of resonances in the 6.0–2.5 ppm region yielded a MR signal dominated by the 2.0 ppm NAA resonance with less than 5% decrease in the 2.0 ppm NAA resonance.

The SNR of the NAA weighted phantom images was compared to that obtained from peak integration of the conventional spectroscopic imaging data. The ratio of SNR values obtained by the two methods was compared to that expected from the acquisition parameters. Neglecting $T_2^*$ decay, the SNR of an imaging sequence is proportional to the voxel volume and the square root of the total image acquisition time. For the NAA weighted imaging sequence, the total image acquisition time is the product of the number of excitation per phase encode step (NEX=4 or 8), the number of phase encode steps ($N_{pe}$=64 or 128), and the length of the data acquisition window ($t_w$=8 ms). For the spectroscopic image, NEX=2 and $N_{pe}$=16×16. Significant $T_2^*$ decay occurs during the 512 ms data acquisition window. Therefore, an effective data acquisition window length which reflects $T_2^*$ losses, as well as the apodization function, was applied to the data. Assuming an exponential apodization function with a decay constant of $T_2^*$, the expected SNR reflects an effective acquisition window of $t_{eff}=T_2^*/2$.

Figure 2A:
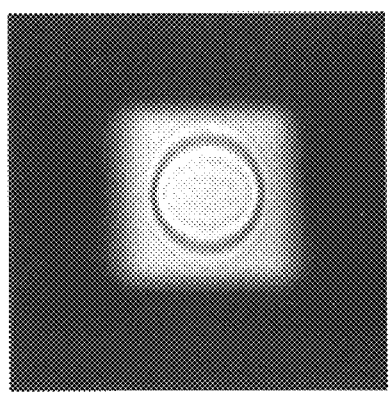
FIGS. 2a–2c are images of a phantom sample obtained with the NAA mapping sequence of FIG. 1.
Figure 2B:
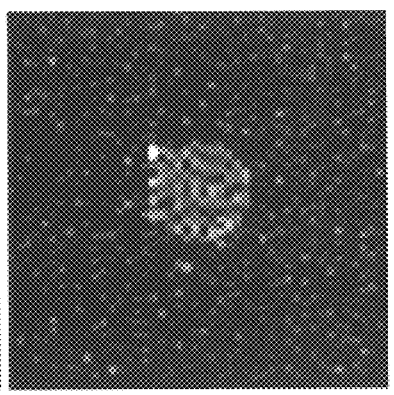
Figure 2C:
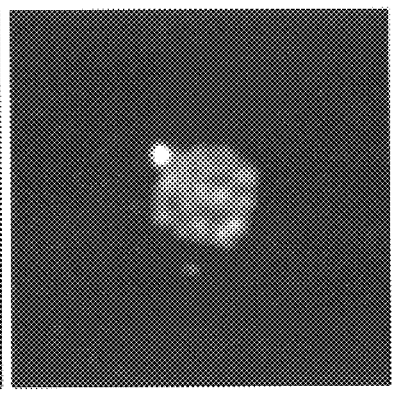
Figure 3A:
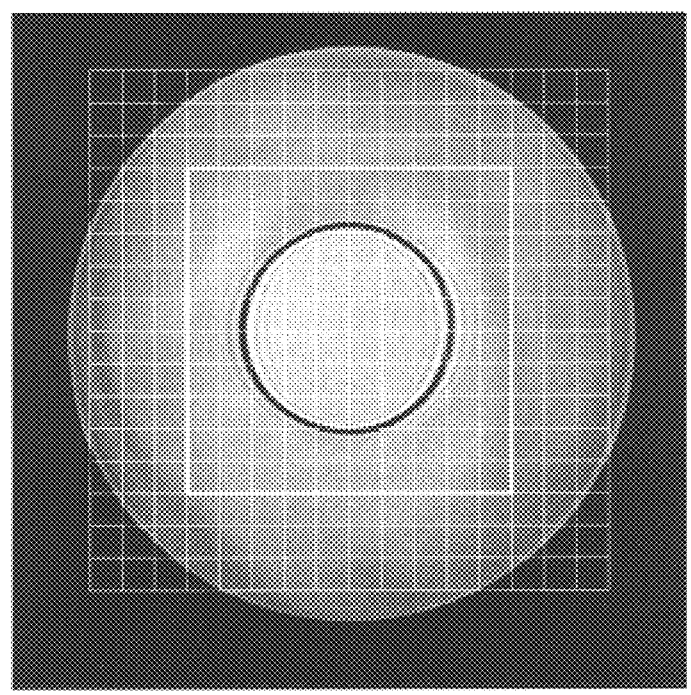
FIGS. 3a–3e are images and spectra related to phantom data acquired immediately after the pulse sequence of FIG. 1 using the same PRESS and suppression parameters.
Figure 3B:
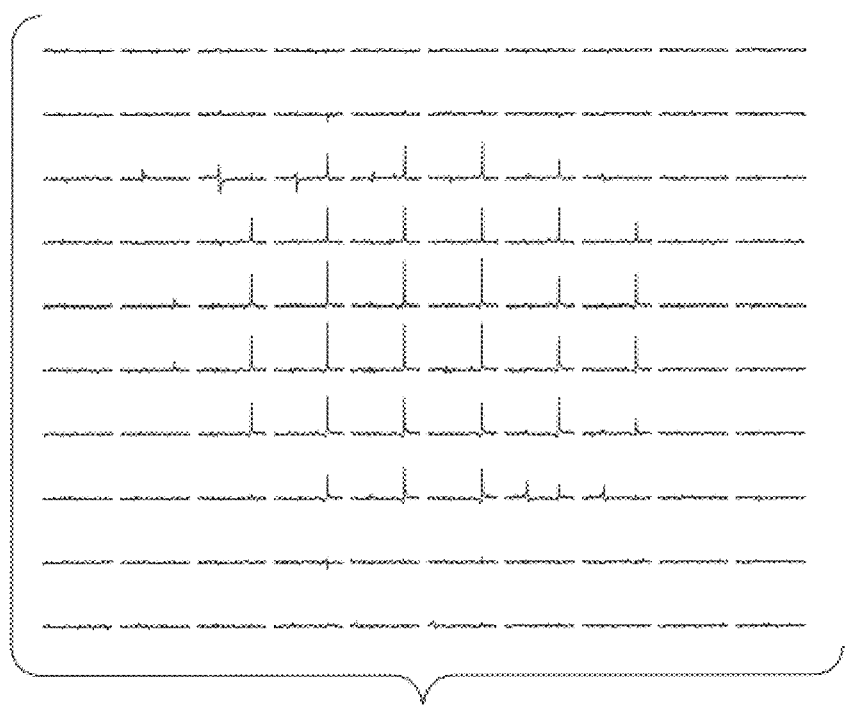
Figure 3C:
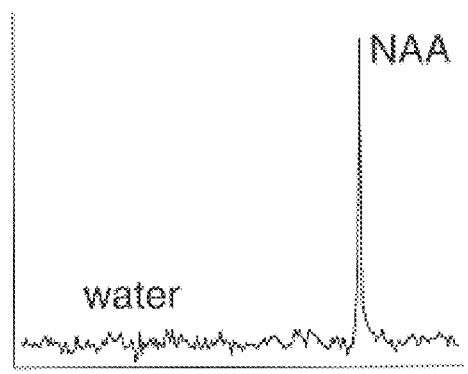
Figure 3D:
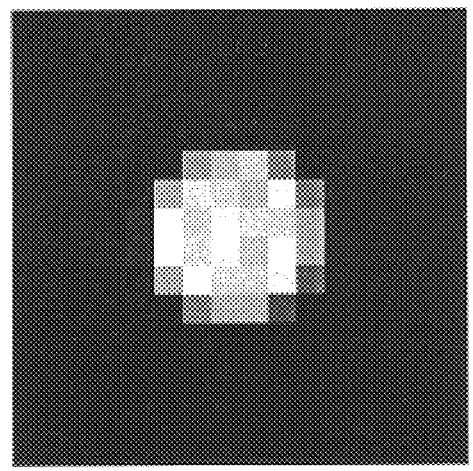
Figure 3E:
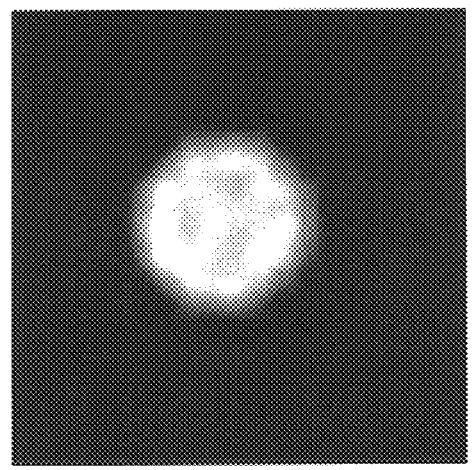

Turning to the NAA weighted images of the phantom measurement, FIG. 2 shows a signal only in the region of the phantom containing NAA (inner cylinder). Water was suppressed in the outer region to below the level of the noise. An artifact is seen in the NAA map at the edge of the inner cylinder, presumably due to unsuppressed water resulting from an air bubble induced susceptibility shift. Integration of the water and NAA region of the PRESS localized spectrum indicated that NAA contributed 92% of the total spectral area, the remaining 8% contributed by water. The conventional CSI acquisition (FIG. 3) confirms the water suppression on a regional basis and demonstrates that the water seen in the PRESS localized spectrum arises from a few voxels near the interface between the two regions. Most of the water contamination seen in the unlocalized spectrum arises from the artifact.

The NAA weighted image had a SNR=5 compared to SNR=50 for the spectroscopic image. The spectroscopic image is expected to have a 12.6-fold higher SNR, based largely on the 4-fold larger voxel volume of the chemical shift image, and also on the 10-fold higher effective data acquisition window of the spectroscopic acquisition.

Figure 5A:
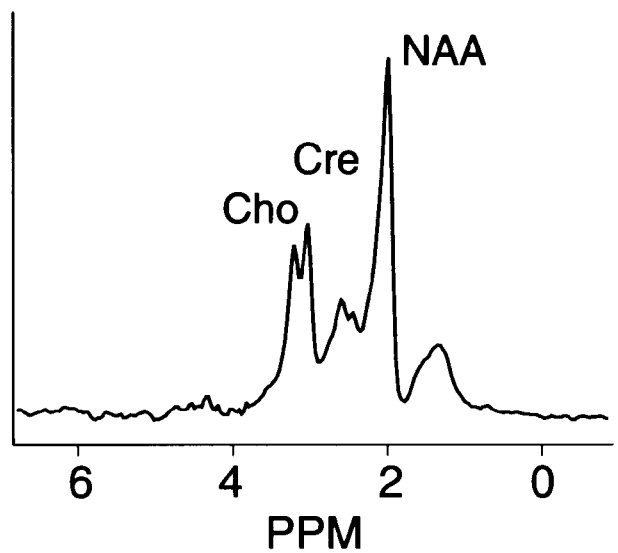
FIGS. 5a–5f show spectroscopic data and images derived from the same examination of FIG. 4.
Figure 5B:
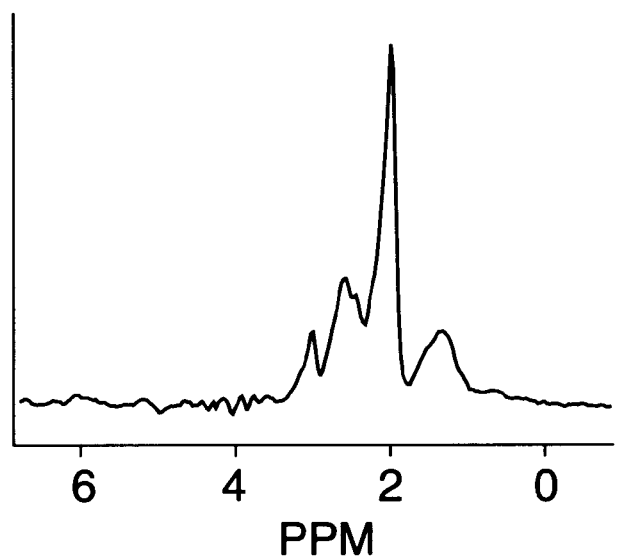
Figures 5C, 5D:
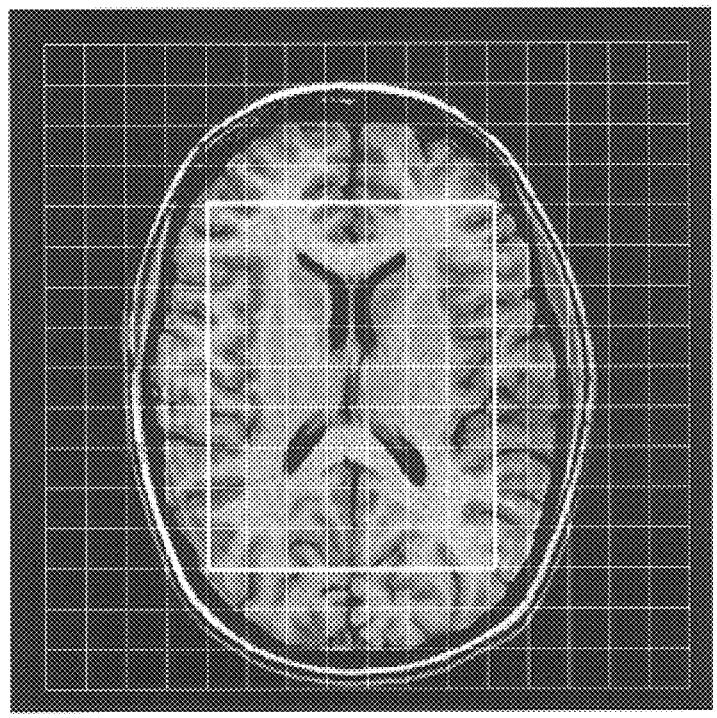
Figure 5E:
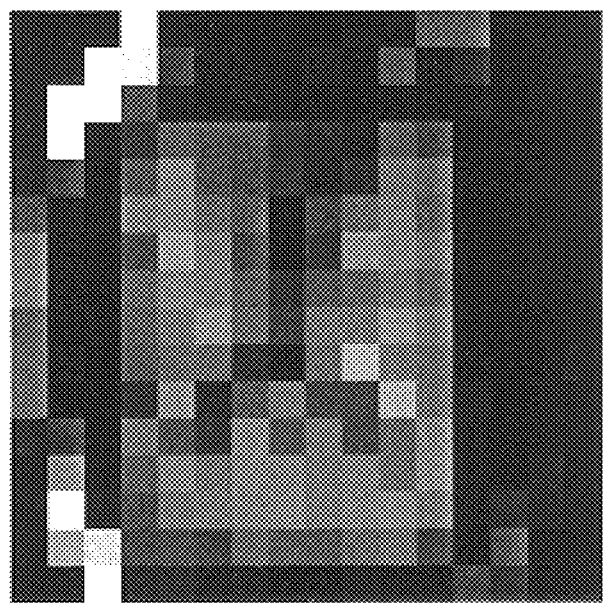
Figure 5F:
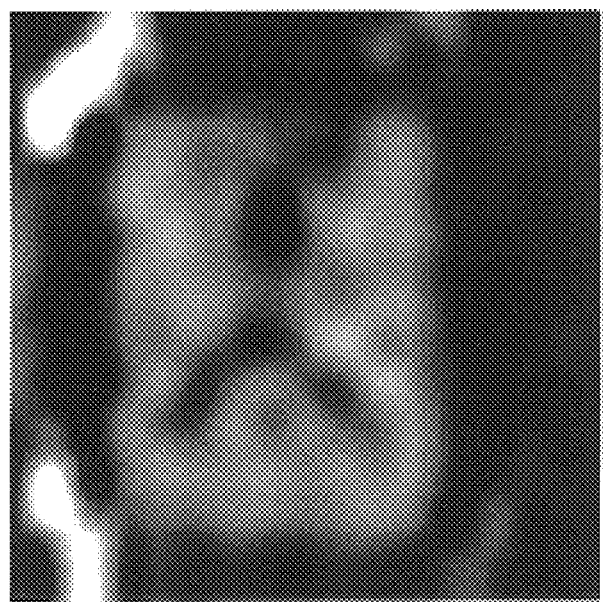
Figure 6A:
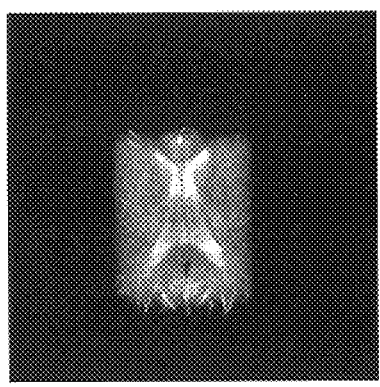
FIGS. 6a–6c are images obtained from a normal subject acquired with the NAA mapping sequence with no water suppression.
Figure 6B:
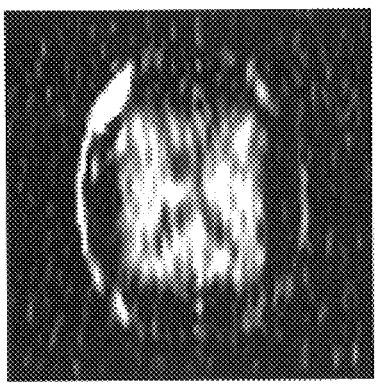
Figure 6C:
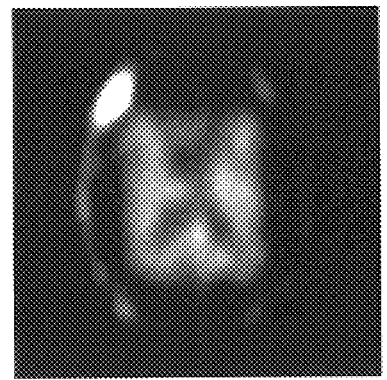
Figure 7A:
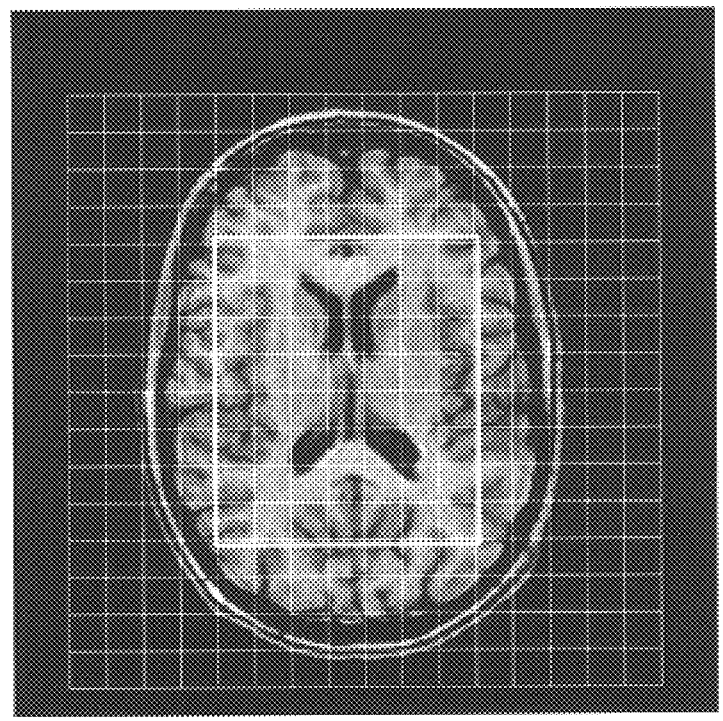
FIGS. 7a–7e are spectra and images acquired from the same examination as FIG. 6.
Figure 7B:
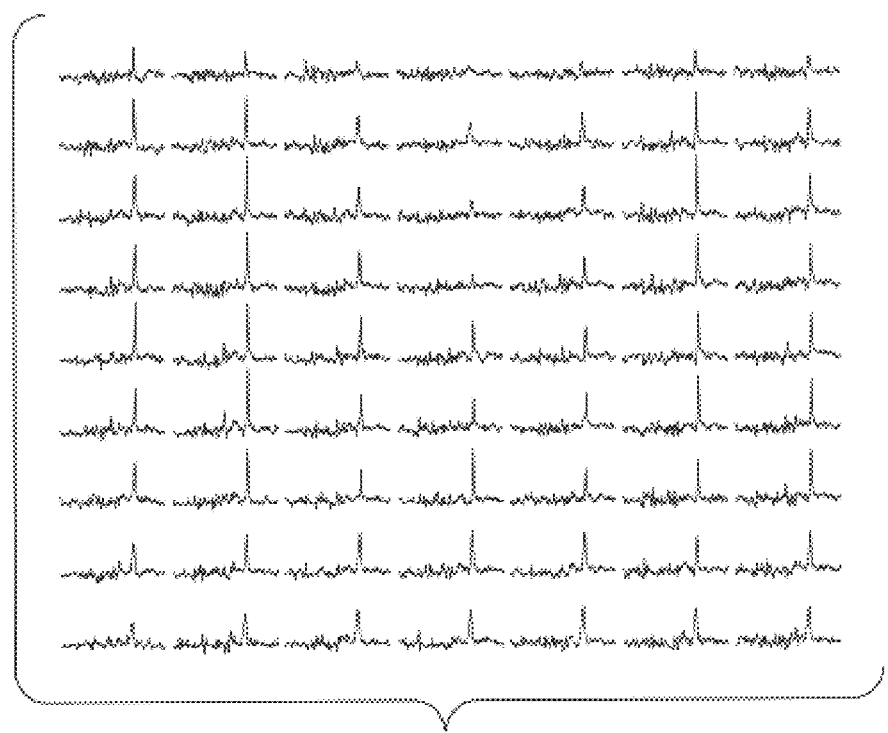
Figure 7C:
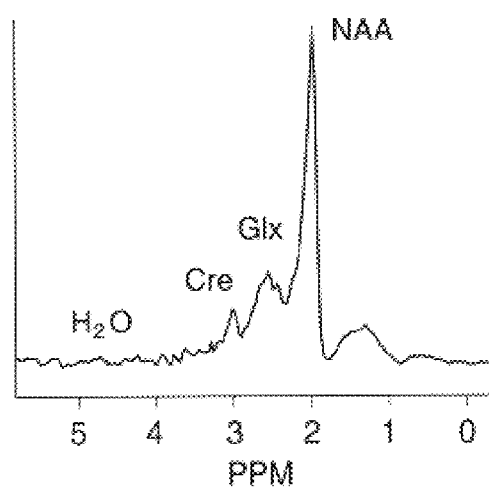
Figure 7D:
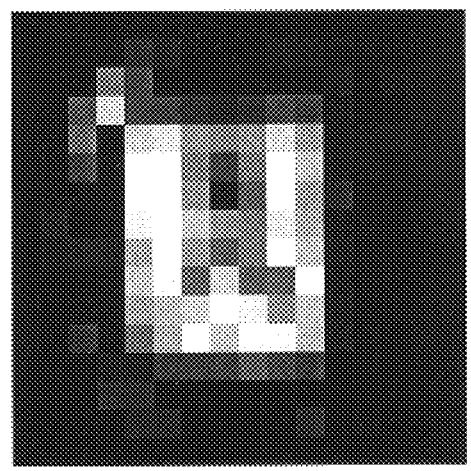
Figure 7E:
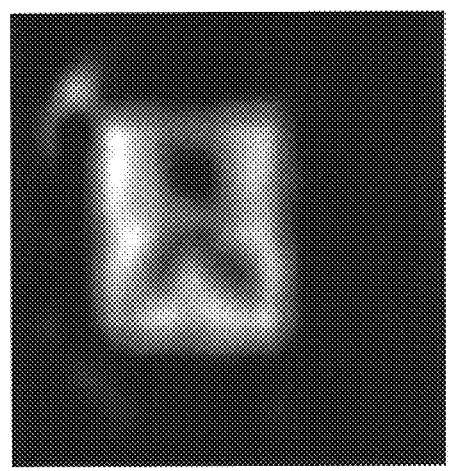
Figure 8:
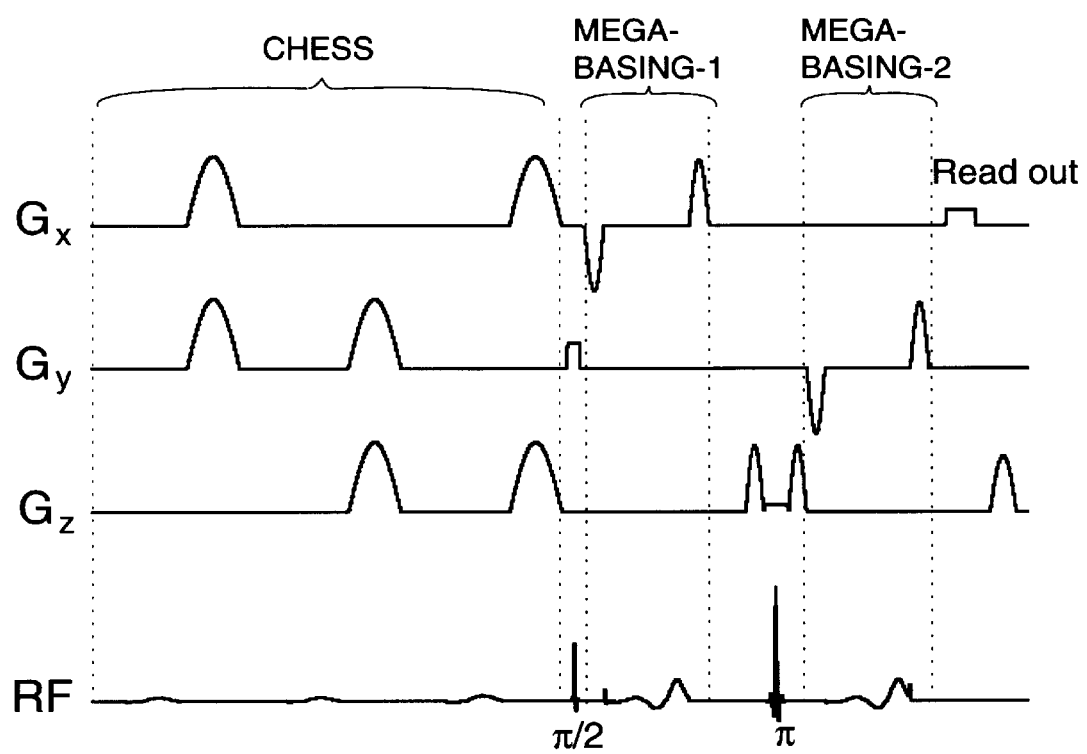
FIG. 8 is an NAA weighted imaging sequence using 2 slice selective pulses to limit the excitation in space to a slice. The phase encode gradient is incorporated into the crusher gradient following the $\pi/2$ rf pulse.
Figure 9:
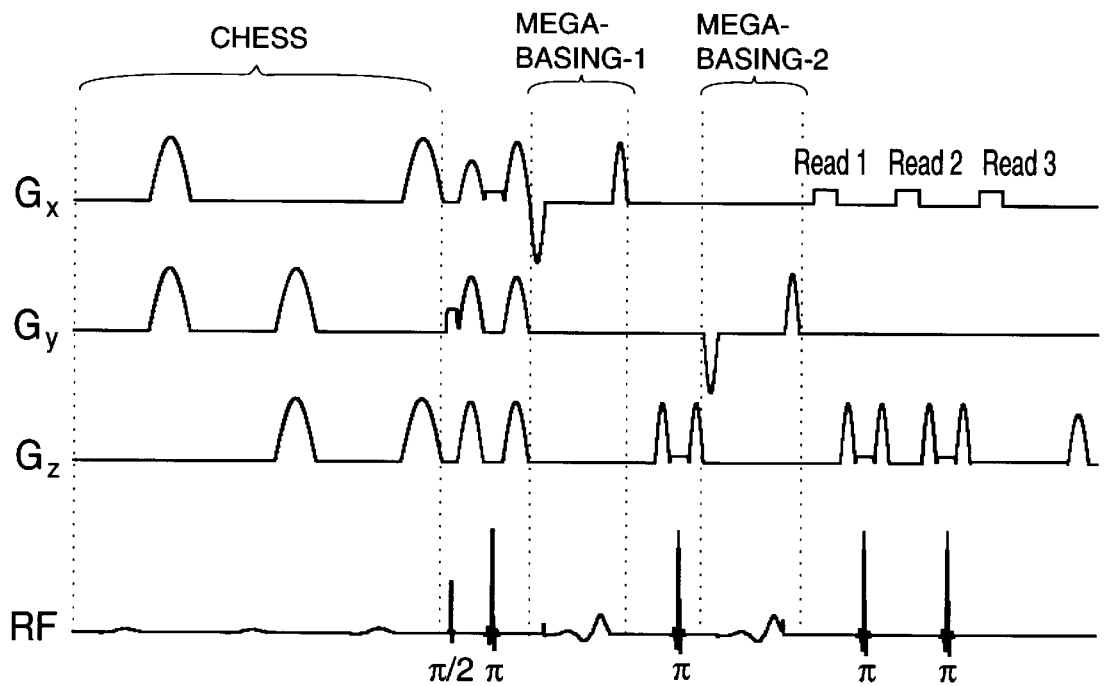
FIG. 9 is an NAA weighted imaging sequence using 3 orthogonal slice selective pulses to limit the excitation in space to a rectangular prism (shoe box) shaped region and two additional $\pi$ pulses which can be slice selective to produce two additional echoes which are encoded with readout gradients. The additional echoes can produce redundant information from the same slice as the first echo to gain relaxation time information or increase sensitivity. Alternatively, the additional echoes can be encoded with additional phase encode gradients to decrease the minimum imaging time.
Figure 10:
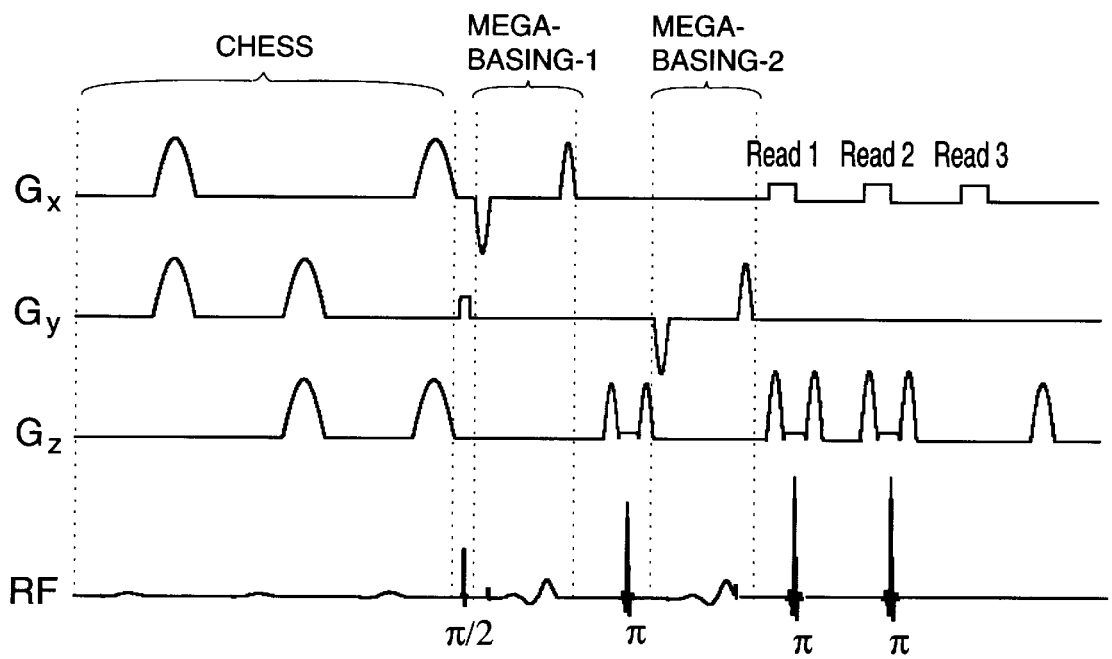
FIG. 10 is an NAA weighted imaging sequence using 2 slice selective pulses to limit the excitation in space to a slice as in FIG. 2 but showing the use of 2 additional $\pi$ pulses and readout gradients. Alternatively, the additional echoes can be encoded with additional phase encode gradients to decrease the minimum imaging time.
Figure 11A:
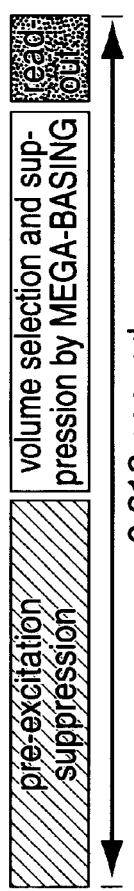
FIGS. 11a–11c are schemes for multi-slice NAA mapping.
Figure 11B:
Figure 11C:
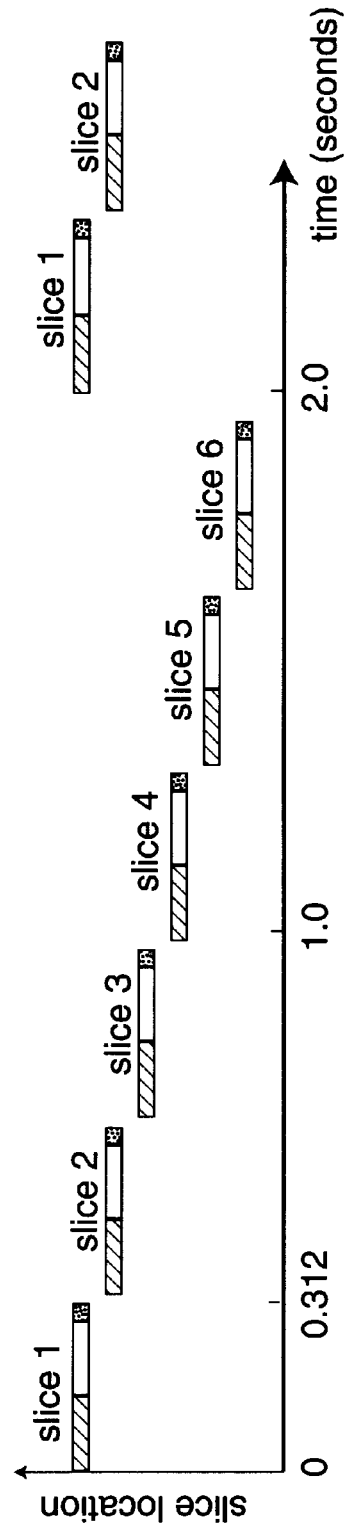

A 256×128 NAA weighted image from the brain of a normal adult subject was taken (FIG. 4a), and low pass filtered to 1 cm in-plane resolution. A lipid artifact is observed, localized outside of the brain. For comparison, a water image was acquired with the same PRESS localization, image matrix, and FOV as the NAA weighted image (FIG. 4b). Spectroscopic imaging data was acquired in the same examination (FIG. 5). The PRESS localized spectrum illustrates complete suppression of the water resonance and suppression of the choline and creatine resonances with less than 5% alteration of the NAA resonance (FIGS. 5a and 5b). The spectra from the CSI array show complete suppression of the water resonance throughout the PRESS localized region (FIGS. 5c and 5d). NAA maps formed by integrating the NAA peak are shown in FIGS. 5e and 5f.

Results from a second normal adult subject are shown in FIGS. 6a–6c and 7a–7e. The PRESS localized spectra show contributions from the methyl group of NAA (2.0 ppm), creatine (3.0 ppm), lipids, and the 3.0 ppm to 2.1 ppm resonances which contain the glutamate, glutamine and aspartate resonances of NAA. The relative signal contributions to the brain region of the NAA weighted images was estimated based on the area of these resonances in the PRESS localized spectrum. Since the lipid contribution measured in the PRESS localized spectrum is expected to be spatially localized outside the brain and contribute principally to the ring artifact seen in the NAA weighted image, the lipid area was excluded from the estimation of the relative contributions to the brain signal. Integration of the water and metabolite regions after fitting and subtraction of the methyl NAA resonance showed that NAA contributed 72% of the unlocalized spectrum while water contributed 2% and the choline, creatine and glutamate plus glutamine resonances contributed 26%. Thus, the principal contamination in the NAA weighted brain image appears to arise from glutamate and glutamine. Since glutamate and glutamine have a short effective $T_2$ compared to NAA, the use of a longer echo time could also reduce their contribution to the image.

C. Advantages

Conventional MR imaging (MRI) techniques can be used with the methods of the invention without requiring spectral information. The disclosed methods therefore provides several advantages.

First, the minimum imaging time is reduced. For example, the minimum image time for a 256×64 pixel NAA image is one minute. An imaging time can be any multiple of this value.

Although a high readout bandwidth was used to demonstrate the ability to acquire NAA weighted images with short data acquisition window lengths, a single high bandwidth acquisition in each TR period does not optimize the SNR of the measurement. Since the SNR is proportional to the square root of the total sampling time, a lower readout bandwidth would allow increased SNR.

Second, the available image matrix size is over 8 times greater than the image matrix of previously known techniques. For example, image matrices of 256×64, or 256×128, and even 256×256 have been produced.

Third, after the NAA resonance is isolated according to the invention, conventional MR image reconstruction algorithms such as those already found on commercial, clinical MR scanners are capable of automatically reconstructing and displaying the NAA image. As a practical matter, this reduces instrumentation costs and operator time required to obtain a clinical image.

Fourth, the data acquisition window is no longer tied to the spectral resolution. The resulting up to 50-fold shorter data acquisition window, and the ability to trade SNR for bandwidth, allows the immediate use of multi-echo and multi-slice acquisition techniques, developed for conventional MRI, in NAA imaging. In short, the disclosed method provides flexible ranges for imaging time and image resolution. For example, $T_2$ of NAA is relatively long compared to $T_2^*$ in vivo. It is estimated that a train of 8 echoes could be acquired within $T_2$ period of NAA (~350 ms). The shorter data acquisition period also has the potential to facilitate the acquisition of multiple interleaved slices. With the parameters used in this study, the RF and gradient pulses require the first 312 ms of the TR period suggesting that up to 6 interleaved slices could be obtained with TR=2 s.

Finally, the use of a relatively short readout period is expected to reduce motion sensitivity in the readout direction compared to phase encoding techniques. Other embodiments and advantages will be apparent from the examples, FIGS. 8–12 describing variations of the disclosed method, and the claims below.

TABLE 1

COMPARISON OF CHARACTERISTICS

| | Disclosed Method | CSI/MRSI | EP-CSI |
|---|---|---|---|
| minimum imaging time for a 256 × 128 matrix and a TR of 2 seconds | 256 seconds (4.27 min.) | 65,536 seconds (18 hours) | not yet achieved |
| minimum imaging time for a matrix of at least 32 × 32 and a TR of 2 seconds | 64 seconds | 2,048 seconds | 64 seconds |
| reconstruction method for the NAA map of a slice | 2 dimen. Fourier transform. (FT) | 3 dimensional FT, phasing and filtering in spectral domain, curve-fit or integration of the NAA region | Re-gridding of the non-rectilinear data then FT and spectral processing as in CSI/MRSI |
| can reconstruction be done automatically | yes | no | no |
| can reconstruction be done on a commercial MR scanner | yes | no | no |
| minimum length of readout or data acquisition window | 8 ms | >200 ms required for useable spectral resol. | >200 ms required for useable spectral resol., limited by gradient perform. to 200 ms |
| Number of echoes that can be acquired before NAA decays by one T2 = 350 ms time constant. Assuming first echo is formed at time TE = 144 ms, the minimum readout or data acquisition window length is used and 10 ms is needed for the pulses to generate each additional echo. | 8 | 1 | 1 |
| Number of slices that can be acquired within a TR = 2 seconds period assuming an echo time of TE = 144 ms is used and that the pulses prior to the echo require 312 ms. After the echo, the minimum readout or data acquisition window length is used. | 6 | 3 | 3 |
| spectral resolution | not applicable | good, but requires long data acquisition window | poor, due to the difficulty of maintaining oscillating read gradient for 200 ms and eddy current |

EXAMPLES

Example 1
Double Stop-Bands

The disclosed method can be adapted to produce two suppression bands with bandwidths from 1 to 2.5 ppm in the band selective inversion with gradient dephasing. This is a 2 stop-band BASING method, in contrast to the 1 stop-band BASING method described above. Two stop-bands allow imaging of a marker compound where there is at least one interfering resonance upfield from the resonance of the marker compound, and at least one interfering resonance downfield from the marker compound resonance. The double stop band method is generally described in the original BASING paper. Star-Lack et al., *Magn. Reson. Med.* 38:311–321, (1997), hereby incorporated by reference.

For NAA imaging, two stop-bands can suppress lipid resonances (upfield from NAA) as well as the water resonance (downfield from NAA), preferably with high field strength imagers (3T or 4T). In one example relating to NAA, the first suppression band includes water, choline and phosphocreatine resonances, while the second band includes lipid resonances near 1.5 ppm but does not include the NAA resonance at 2.0 ppm. In another example relating to non-neuronal tissue, the first suppression band includes the water resonance but not the choline or phosphocreatine or citrate resonances at about 3.2 ppm, 3.0 ppm, and 2.7 ppm. The second band includes lipid resonances near 1.5 ppm and the NAA resonance at 2.0 ppm. This allows imaging of the choline marker or citrate marker in non-neuronal tissue such as breast or prostate cancers.

Example 2
Choline/Phosphocreatine in Neuronal and Non-Neuronal Tissue

Two stop-bands allow choline imaging in neuronal tissue since such imaging requires the suppression of both the water resonance (downfield from choline) and also the NAA resonance (upfield from choline).

In choline imaging of non-neuronal tissue (such as a cancer of the lymph nodes or breast), one stop band would suppress water (downfield from choline) and the other stop band would suppress lipid (upfield from choline). The tissue is tumor embedded in normal tissue such as breast cancer lesions in normal breast tissue or associated lymph nodes. The first suppression band includes the water resonance, and the second suppression band includes the lipid resonances near 1.5 ppm. In one embodiment, the second suppression band does not include the choline and phosphocreatine resonances at 3.2 ppm and 3.0 ppm. The remaining marker compound resonances are attributed to choline and phosphocreatine, which often overlap and are difficult to separate by this method. Since the phosphocreatine level is generally stable, changes in the combined choline and phosphocreatine resonances are attributed to changes in choline levels.

Example 3
Multiple Spin Echoes

The disclosed method can be adapted to include additional 180° RF refocusing pulses to generate additional spin echos. For example, each spin echo is encoded with a readout gradient to acquire the same image at different echo times to infer regional information about the variation of the NAA signal with echo time by measuring the T2 relaxation time. Alternatively, each spin echo is encoded with a readout gradient to provide multiple maps of NAA which are averaged together to improve sensitivity.

In another example, each spin echo is encoded with a readout and phase encode gradient to allow multiple phase encode steps to be measured per excitation step. This decreases the minimum image acquisition time, and increases the image sensitivity at a given total imaging time (see FIGS. 9 and 10).

As described above, the disclosed method acquires a single echo per excitation sequence, requiring 312 ms for the application of the preexcitation and suppression, volume selective excitation, inversion and dephasing suppression, and readout gradient (of 8 ms length) encoding and a 1.5 second or 2 second recovery period. With these same parameters, and a requirement of 10 ms to add each additional 180 degree refocusing pulse and associated crusher gradients (which include the phase encode gradient if desired), each additional echo requires 18 ms of additional time at the end of the excitation sequence. Since the NAA signal decays with a characteristic decay time T2 (approximately 300 ms), it is preferable to limit the number of spin echos to that which can be acquired in the 300 ms following the initial excitation pulse. For example, in this case, the first spin echo is formed 144 ms after the excitation pulse, indicating that an additional 156 ms remains of the 300 ms NAA decay duration. Up to 8 additional echos can be collected during this time, for a total of between 2 and 9 echoes. Any number of echoes can be used, although even numbers (e.g., 2, 4, 6, or preferably 8) are preferred. This method is especially useful for applications requiring high sensitivity and disorders where a measure of the NAA T2 relaxation time would be valuable for mapping relaxation time changes or for characterizing NAA T2 relaxation time for use with methods that calibrate the molar concentration of NAA in the brain.

Example 4
Multiple Spatial Slices

In this aspect, marker compound images, such as NAA images, are acquired from multiple slices in the same imaging acquisition. This is achieved by applying pre-excitation suppression, slice selective excitation, suppression by band selective inversion with gradient dephasing, and readout gradient encoding to additional spatial slices in the order described through the subject's body during the recovery time between successive phase encode steps (see, e.g., FIG. 11). The spatial slices are defined by the slice selective excitation or the volume selective excitation step. Therefore, to avoid interference between the excitations, the spatial slices preferably do not overlap spatially. The spatial slices can be acquired in two or more interleaved acquisitions to allow contiguous slices to be obtained with minimal interference between adjacent slices.

In practice, for example, the method above requires 312 ms for the application of the pre-excitation and suppression, volume selective excitation, inversion and dephasing suppression, and readout gradient encoding techniques and a 1.5 second to 2 second recovery period. With these parameters, data from up to 5 additional slices is acquired in the 2 second recovery period. The data from the separate spatial slices is stored and reconstructed to produce NAA maps from each of the 6 slices. This technique is useful for applications where more than one slice through the anatomy of interest is needed to visualize the pathology of the organ.

Example 5
Clinical Method

One aspect of the invention features a slice selective spin echo excitation where additional slices are excited and encoded during the otherwise unused time period of the sequence. Three or more chemical shift selective pre-excitation pulses and associated crusher gradients are used to suppress the resonances downfield from NAA. The pre-excitation pulses have a flip angle of $\pi/2$ with the flip angle of the last pre-excitation pulse being adjusted to maximize the suppression of the water resonance. The center of the excitation bands of the pre-excitation pulses are centered near the water resonance. The slice selective spin echo or double spin echo excitation utilizes an echo time of 100 ms to 300 ms to minimize lipid signal contributions and provide time for the band selective inversion pulses and their associated gradient dephasing pulses. The pre-excitation and band selective inversion pulses are shaped RF pulses designed to provide sharp transition bandwidths and low in-band and out-of-band ripple. The band selective inversion pulses are 20 ms to 50 ms in length. The center of the inversion band is initially placed on the water resonance and adjusted so that the brain phosphocreatine and choline resonances at 3.2 ppm and 3.0 ppm are suppressed without affecting the NAA resonance. The band selective inversion pulses must have a bandwidth of at least 1.7 ppm to ensure suppression of the 4.7 ppm water resonance in addition to the phosphocreatine and choline resonances at 3.2 ppm and 3.0 ppm. The resulting magnetic resonance signal arises predominantly from NAA and is encoded with 64 to 256 phase encode steps and 128 to 256 points in readout direction. The readout bandwidth is 16 kHz. The excitations are averaged 2 to 8 times to increase the sensitivity of the NAA map. The phase encode and averaging steps are repeated at a repetition time (TR) of 1.5 seconds to 3 seconds. The number of excitations averaged for a given number of phase encode steps and TR is chosen to give a total imaging time of 8 to 20 minutes.

OTHER EMBODIMENTS

Based on the disclosure, the essential features and advantages of the present invention can be ascertained. Other embodiments of the invention, which are within the spirit and scope of the claims, can be easily developed or adapted to various usages and conditions.

What is claimed is:

1. A method for imaging the distribution of n-acetylaspartic acid (NAA) in mammalian neuronal tissue, said method comprising:

a) exciting said neuronal tissue to generate magnetic resonance signals, including signals corresponding to NAA;

b) suppressing non-NAA magnetic resonance signals by a combination of band selective inversion with gradient dephasing, and chemical shift selective pre-excitation;

c) encoding a first spatial dimension of said NAA signal with readout encoding and a second spatial dimension of said NAA signals with gradient phase encoding; and d) using said encoded first and second spatial dimensions to image. by reconstruction. said distribution of said NAA in said tissue.

2. A method of claim 1, wherein said suppressing step (b) suppresses magnetic resonances down field from 2.5 ppm.

3. A method of claim 2, wherein said chemical shift selective pre-excitation includes an excitation bandwidth of about 1.8 ppm to 2.5 ppm, said bandwidth including the water resonance.

4. A method of claim 2, wherein said band selective inversion includes an excitation bandwidth of about 1.8 ppm to 2.5 ppm, and said dephasing produces a suppression band which includes the water resonance at about 4.7 ppm, the choline resonance at about 3.2 ppm, and the phosphocreatine resonance at about 3.0 ppm.

5. A method of claim 1, wherein the imaging step (d) uses two-dimensional Fourier transformation.

6. A method of claim 1, wherein the encoding step (c) has a minimum imaging time of between 30 and 260 seconds for a spatial encoding matrix of 256×256.

7. A method of claim 1, wherein said exciting step (a) includes slice selective spin-echo excitation.

8. A method of claim 1, wherein said exciting step (a) includes volume selective double spin-echo excitation.

9. A method of claim 8, wherein said volume selective double spin-echo excitation includes orthogonal slice selection pulses in a double spin echo configuration (90°-180°-180°).

10. A method of claim 9, wherein said volume selective double spin-echo excitation includes a STEAM localization configuration (90°-90°-90°).

11. A method for imaging the distribution of a marker compound selected from n-acetyl aspartic acid, citrate, choline, phosphocreatine, and lactate in mammalian tissue, said method comprising:

i) exciting said tissue to generate magnetic resonance signals, including signals corresponding to said marker compound;

ii) suppressing non-marker compound magnetic resonance signals using band selective inversion with gradient dephasing, and chemical shift selective pre-excitation;

iii) encoding a first spatial dimension of said marker compound signal with readout encoding and a second spatial dimension of said marker compound signal with gradient phase encoding; and iv) using said encoded first and second spatial dimensions to image, by reconstruction, said distribution of said marker compound in said tissue.

12. A method of claim 11, wherein said tissue is prostate tissue and said marker is citrate.

13. A method of claim 11, wherein said marker is lactate, choline, or phosphocreatine.

14. A method of claim 11, wherein said tissue is neuronal tissue and said marker is n-acetyl aspartic acid, choline, or phosphocreatine.

* * * * *